United States Patent
Li et al.

(10) Patent No.: US 7,100,676 B2
(45) Date of Patent: Sep. 5, 2006

(54) FAN DUCT

(75) Inventors: Dong-Yun Li, Shenzhen (CN); Min Li, Shenzhen (CN); Hong-Cheng Yang, Shenzhen (CN); Hong-Bo Shi, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 54 days.

(21) Appl. No.: 11/016,079

(22) Filed: Dec. 17, 2004

(65) Prior Publication Data
US 2005/0279486 A1 Dec. 22, 2005

(30) Foreign Application Priority Data
Aug. 6, 2004 (CN) .................. 2004 2 0072526

(51) Int. Cl.
*F28F 7/00* (2006.01)
(52) U.S. Cl. .................. 165/80.3; 165/81; 165/121
(58) Field of Classification Search .................. 165/81, 165/80.3, 121; 454/64; 361/695–697; 403/109.1, 403/109.2, 109.6
See application file for complete search history.

(56) References Cited

U.S. PATENT DOCUMENTS

| | | | | |
|---|---|---|---|---|
| 619,297 | A * | 2/1899 | Fraser .......................... 454/64 |
| 1,365,851 | A * | 1/1921 | Reynolds .................... 403/107 |
| 3,474,833 | A * | 10/1969 | Garrette et al. ............. 138/120 |
| 4,038,913 | A * | 8/1977 | Earley .......................... 454/64 |
| 5,476,297 | A * | 12/1995 | Lombard .................... 294/19.2 |
| 5,586,865 | A * | 12/1996 | Yin .......................... 415/213.1 |
| 5,917,697 | A * | 6/1999 | Wang .......................... 361/695 |
| 6,130,819 | A | 10/2000 | Lofland et al. |
| 6,213,672 | B1 * | 4/2001 | Varga ...................... 403/109.2 |
| 6,404,630 | B1 * | 6/2002 | Lai ............................. 361/697 |
| 6,435,754 | B1 * | 8/2002 | Canale .................... 403/109.2 |
| 6,914,781 | B1 * | 7/2005 | Rotta et al. ................. 361/690 |
| 2004/0004814 | A1 * | 1/2004 | Chen .......................... 361/694 |
| 2004/0100768 | A1 * | 5/2004 | Chen et al. ................. 361/697 |
| 2005/0073812 | A1 * | 4/2005 | Lin ............................ 361/695 |

FOREIGN PATENT DOCUMENTS

JP 60-155838 * 8/1985
JP 60-164145 * 8/1985

* cited by examiner

*Primary Examiner*—Teresa J. Walberg
(74) *Attorney, Agent, or Firm*—Morris Manning & Martin LLP; Tim Tingkang Xia, Esq.

(57) ABSTRACT

A fan duct includes an immovable cylinder and a movable cylinder. The movable cylinder is capable of sliding in an axial direction of the immovable cylinder. One of the immovable cylinder and the movable cylinder defines at least one groove in an axial direction thereof. Each groove defines at least two locating slots communicating with the respective groove. The other of the immovable cylinder and the movable cylinder forms at least one pin corresponding to the groove, the pin being capable of selectively sliding into any one of the locating slots. A related heat dissipation assembly including the fan duct is also disclosed.

15 Claims, 3 Drawing Sheets

FAN DUCT

BACKGROUND OF THE INVENTION

1. Field of the Invention

This invention is related to a fan duct, and particularly to a fan duct corresponding to a heat sink.

2. Description of Prior Art

Electronic devices such as central processing units (CPUs) frequently generate large amounts of heat during normal operation, therefore a heat dissipation assembly is used to dissipate heat from the electronic device. Conventionally the heat dissipation assembly comprises one or more pairs of heat sinks and fans. The bottom surface of a heat sink is attached to an electronic device, while the top surface form thereon a plurality of fins defining a plurality of channels therebetween. A fan is installed at one side of the fins for producing airflow through the channels to accelerate heat convection. However, in above cases, there produce refluence of heat airflow constantly.

In order to prevent producing refluence of heat air flow, a cylindrical fan duct is used. The fan duct comprises a cylinder. One end of the cylinder hoods the top of a fan, while the other end is attached to a computer case. The computer case defines a plurality of apertures corresponding to the fan. In operation, outside cooling air flows through the fan duct to blow to the heat sink or hot air from the heat sink flows away from the computer case via the fan duct, thereby preventing producing refluence of heat air flow. The height of the fan duct is fixed and only fits a kind of special computer cases whose height is fixed or whose inner space is fixed. However, there are so many kinds of computer cases which have a different height or inner space. Therefore, there needs a fan duct which can adapt to computer cases with different heights or inner space.

SUMMARY OF THE INVENTION

Accordingly, an object of the present invention is to provide a fan duct whose height is adjustable in order to adapt to computer cases with different heights or inner space.

To achieve the above-mentioned object, in one aspect of the present invention, a fan duct includes an immovable cylinder and a movable cylinder. The movable cylinder is capable of sliding relative to the immovable cylinder in an axial direction of the immovable cylinder. One of the immovable cylinder and the movable cylinder defines at least one groove in an axial direction thereof. Each groove defines at least two locating slots communicating with the respective groove. The other of the immovable cylinder and the movable cylinder forms at least one pin corresponding to the groove, the pin being capable of selectively sliding into any one of the locating slots.

Other objects, advantages and novel features of the present invention will be drawn from the following detailed description of preferred embodiments of the present invention with the attached drawings, in which:

DETAILED DESCRIPTION OF THE PREFERRED EMBODIMENT

Figure 1:
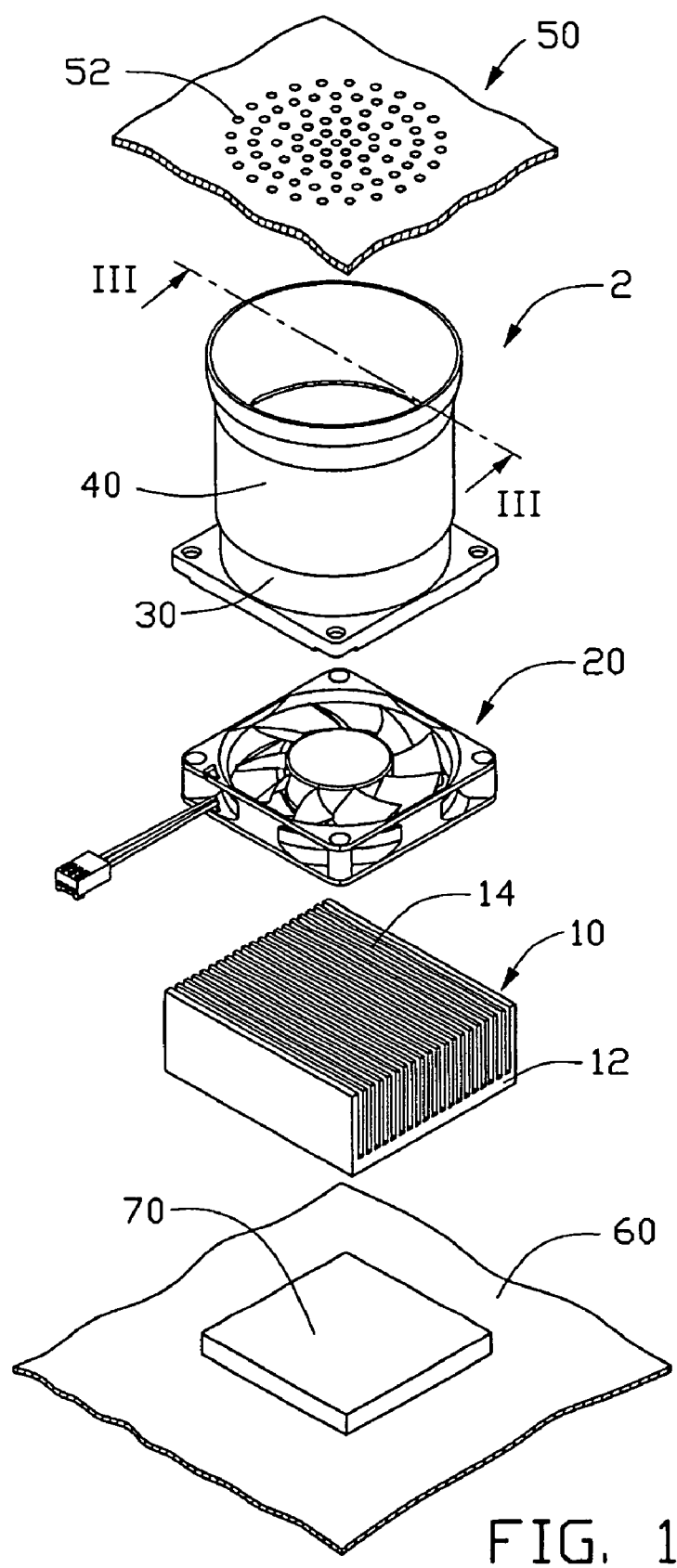
FIG. 1 shows the exploded view of a heat dissipation assembly using a fan duct in accordance with the preferred embodiment of the present invention.

Referring to FIG. 1, a heat dissipation assembly comprises a fan duct 2, a fan 20, and a heat sink 10. The heat sink 10 comprises a base station 12 and a plurality of fins 14 thereon. The bottom surface of the base station 12 can be attached to a central processing unit (CPU) 70 amounted on a circuit board 60.

Figure 2:
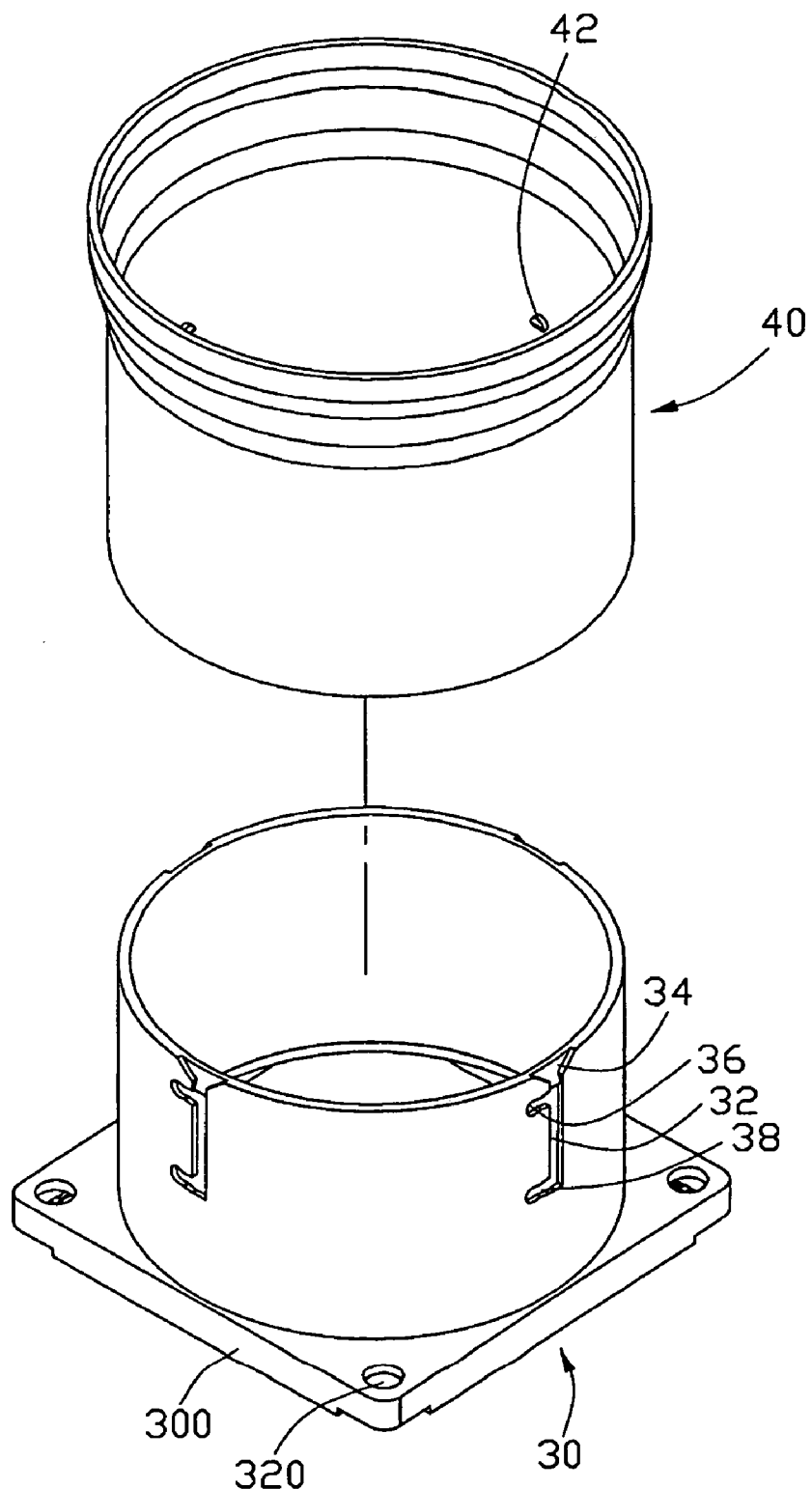
FIG. 2 is the exploded view of the fan duct of FIG. 1.

Referring to FIG. 2, the fan duct 2 comprises an immovable cylinder 30 as a first duct portion and a movable cylinder 40 corresponding to the immovable cylinder 30 as a second duct portion. A square board 300 is formed at the bottom of the immovable cylinder 30, at any of four corners of which an aperture 320 is formed for amounting the fan 20. There are four grooves formed symmetrically on periphery of the immovable cylinder 30 and each groove 32 extends axially along the immovable cylinder 30. At the top of the immovable cylinder 30 an enlarged trapezoid opening 34 is formed, and the super-side of the trapezoid opening 34 is longer than the sub-side. A pair of locating slots 36, 38 are formed at two ends of each groove 32 and communicate with the groove 32. Both the locating slots 36 and 38 extend circumferentially along with the immovable cylinder 30.

Circled around the inner wall of the movable cylinder 40 four half-columned pins 42 are formed symmetrically, which can be understand, the pins 42 can be in other shape, such as knobby. One end of the movable cylinder 40 slideably hoods the immovable cylinder 30, while the other end is for being attached to a computer case 50. A plurality of apertures 52 is defined in the computer case corresponding to the movable cylinder 40.

Figure 3:
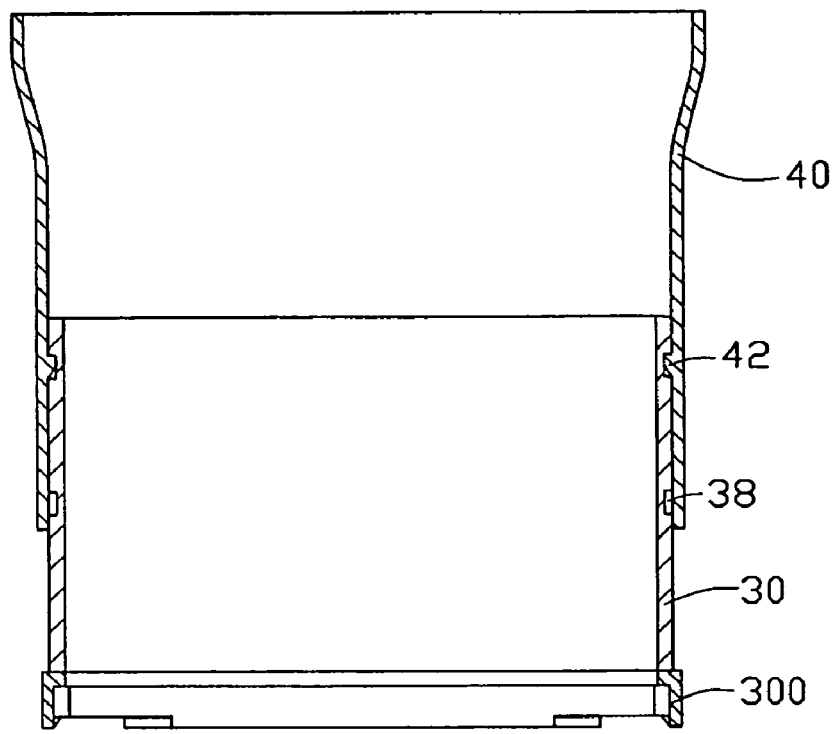
FIG. 3 is sectional view of the fan duct of FIG. 1 along the line III—III.
Figure 4:
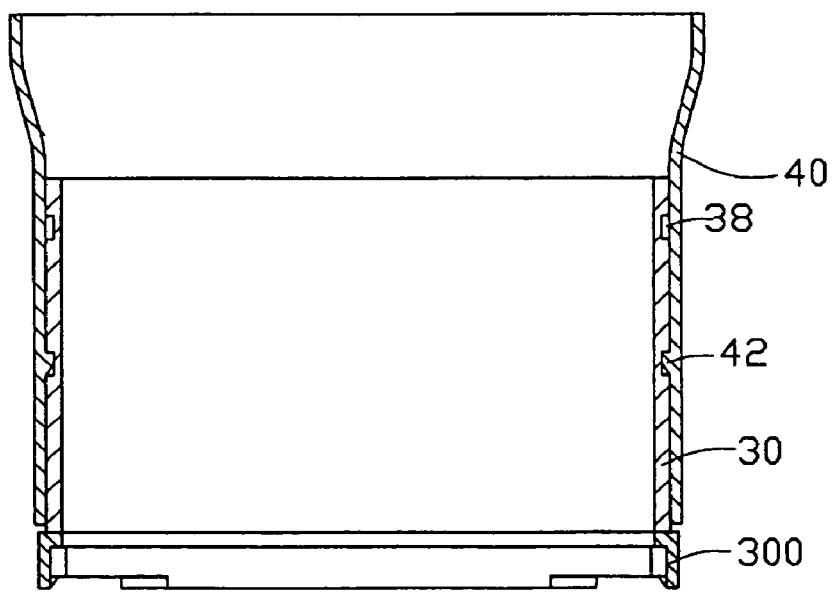
FIG. 4 is sectional view of the fan duct in another status.

Referring also to FIG. 3~FIG. 4, when installing, one end of the fan duct 2 is fixed on the fan 20, while the other end of the fan duct 2 is mounted on the computer case 50. In another embodiment, the fan 20 is mounted on the computer case 50, and one end of the fan duct 2 is fixed on the fan 20 while the other end of the fan duct 2 is mounted on the heat sink 10. One end of the movable cylinder 40 hoods the immovable cylinder 30 with the pins 42 aligned with the respective grooves 32. When pressing the movable cylinder 40, the pins 42 slide into the respective openings 34, and then slide into the corresponding grooves 32 when the movable cylinder 40 is further pressed. When the pins 42 slide to the position corresponding to the slot 36, the pins 42 can be forced to slide into the slot 36 by pivoting the movable cylinder 40. In the same way, the pins can be forced to slide into the slot 38 by further pressing and then pivoting the movable cylinder 40.

It can be understand, in accordance with a second embodiment, the pins 42 can be formed on the periphery of the movable cylinder 40, while the groove 32 is formed in the inner wall of the immovable cylinder 30. When installing, the movable cylinder 40 hoods the immovable cylinder 30. In accordance with a third embodiment, the pins 42 can be formed in the immovable cylinder 30, while the groove 32 is formed in the movable cylinder 40. Besides, the groove 32 can define more than two locating slots to adapt computer cases with different height. There can be formed more than one groove 32.

The embodiment and method described herein are merely illustrative of the principles of the present invention. Other arrangements and advantages may be devised by those skilled in the art without departing from the spirit and scope of the present invention. Accordingly, the present invention should be deemed not to be limited to the above detailed description but rather by the spirit and scope of the claims that follow, and their equivalents.

What is claimed is:

1. A fan duct, including:

an immovable cylinder; and a movable cylinder capable of sliding in an axial direction of the immovable cylinder, one of the immovable cylinder and the movable cylinder defining at least one groove in an axial direction thereof, each groove defining at least two locating slots spaced from each other in said axial direction, the other of the immovable cylinder and the movable cylinder forming at least one pin corresponding to said groove, said pin being capable of selectively sliding into any one of the locating slots;

wherein said the other of the immovable cylinder and the movable cylinder covers all of the at least two slots and the at least one groove of the one of the immovable cylinder and the movable cylinder whenever the nin is located in any one of the locating slots.

2. The fan duct as claimed in claim 1, wherein the groove is formed in the periphery of said one of the immovable cylinder and the movable cylinder, while the pin corresponding to the groove is formed on the inner wall of said the other of the immovable cylinder and the movable cylinder without groove therein.

3. The fan duct as claimed in claim 1, wherein the groove is formed in the inner wall of said one of the immovable cylinder and the movable cylinder, while the pin corresponding to the groove is fanned on the periphery of the other of the immovable cylinder and the movable cylinder.

4. The fan duct as claimed in claim 1, wherein an enlarged opening is defined at the top of the groove for guiding said pin to enter said groove.

5. The fan duct as claimed in claim 4, wherein the enlarged opening has a trapezoid cross section.

6. The fan duct as claimed in claim 5, wherein the enlarged opening has a super-side longer than a sub-side thereof.

7. The fan duct as claimed in claim 1, wherein the locating slots extend in a circumferential direction of said one of the inunovable cylinder and the movable cylinder.

8. The fan duct as claimed in claim 1, wherein the movable cylinder has an end expanded arid attached to a computer case.

9. A heat dissipation assembly, including:

a beat sink;

a fan for generating a forced airflow to improve heat dissipation of the heat sink; and a fan duct for guiding said forced airflow, the fan duct including:

an immovable cylinder; and a movable cylinder capable of sliding in an axial direction of the immovable cylinder, one of the immovable cylinder and the movable cylinder defining at least one groove in an axial direction thereof, each groove defining at least two locating slots spaced from each other in said axial direction, the other of the immovable cylinder and the movable cylinder forming at least one pin corresponding to said groove, said pin being capable of selectively sliding into any one of the locating slots;

wherein said the other of the immovable cylinder and the movable cylinder covers all of the at least two locatine slots and the at least one groove of the one of the immovable cylinder and the movable cylinder when the at least one pin of said the other of the immovable cylinder and the movable cylinder engaees into any of the at least two locating slots.

10. The heat dissipation assembly as claimed in claim 9, wherein the groove is formed in the periphery of said one of the immovable cylinder and the movable cylinder, while the pin corresponding to the groove is formed on the inner wall of said the other of the immovable cylinder and the movable cylinder without groove therein.

11. The heat dissipation assembly as claimed in claim 9, wherein the groove is formed in the inner wall of said one of the inirnovable cylinder and the movable cylinder, while the pin corresponding to the groove is formed on the periphery of the other of the immovable cylinder and the movable cylinder.

12. The heat dissipation assembly as claimed in claim 9, wherein an enlarged opening is defined at the top of the groove for guiding said pinto enter said groove.

13. The heat dissipation assembly as claimed in claim 9, wherein the locating slots extend in a circumferential direction of said one of the immovable cylinder and the movable cylinder.

14. The heat dissipation assembly as claimed in claim 9, wherein the fan is mounted on the heat sink and one end of the fan duct is attached to the fan.

15. The heat dissipation assembly as claimed in claim 9, wherein the immovable cylinder has a square board formed at a bottom thereof and attached to the fan.

* * * * *